United States Patent
Weiss

(10) Patent No.: US 9,412,254 B1
(45) Date of Patent: Aug. 9, 2016

(54) DOWNED ITEM DETECTOR

(71) Applicant: Jeffrey N. Weiss, Parkland, FL (US)

(72) Inventor: Jeffrey N. Weiss, Parkland, FL (US)

(*) Notice: Subject to any disclaimer, the term of this patent is extended or adjusted under 35 U.S.C. 154(b) by 153 days.

(21) Appl. No.: 13/842,317

(22) Filed: Mar. 15, 2013

(51) Int. Cl.
*G08B 21/00* (2006.01)
*G08B 21/18* (2006.01)
*G08B 13/08* (2006.01)
*G01P 15/18* (2013.01)
*G06F 17/50* (2006.01)
*G08B 13/14* (2006.01)

(52) U.S. Cl.
CPC ............... *G08B 21/18* (2013.01); *G01P 15/18* (2013.01); *G06F 17/5036* (2013.01); *G08B 13/08* (2013.01); *G08B 13/1436* (2013.01)

(58) Field of Classification Search
CPC ......... G01H 17/00; G01W 1/02; G01W 1/06; H02G 1/02; G02G 7/00; G01S 13/10
USPC ......... 340/538.16, 635, 657, 623, 689, 686.1; 333/24 R; 375/258, 257; 324/105; 73/762, 691, 493, 495, 170.17; 702/141, 158, 57
See application file for complete search history.

(56) References Cited

U.S. PATENT DOCUMENTS

| | | | |
|---|---|---|---|
| 4,272,764 A * | 6/1981 | Herr ..................... | G08B 21/06 340/575 |
| 4,297,683 A * | 10/1981 | Roberts ..................... | 340/539.31 |
| 5,140,257 A * | 8/1992 | Davis ..................... | 324/106 |
| 5,235,861 A * | 8/1993 | Seppa ..................... | 73/862.391 |
| 5,299,528 A * | 4/1994 | Blankenship ..................... | 119/537 |
| 5,425,378 A * | 6/1995 | Swezey ..................... | A61B 5/1071 600/587 |
| 5,477,211 A * | 12/1995 | Reynolds ..................... | A61G 5/10 135/65 |
| 5,517,864 A * | 5/1996 | Seppa ..................... | 73/862.391 |
| 5,522,092 A * | 6/1996 | Streb ..................... | G08B 21/06 2/209.13 |
| 5,565,783 A * | 10/1996 | Lau ..................... | G01R 15/142 324/127 |
| 5,625,344 A * | 4/1997 | Shukla ..................... | G01F 23/003 200/220 |
| 5,853,219 A * | 12/1998 | Santuccio ..................... | A61H 3/00 135/66 |
| 5,860,740 A * | 1/1999 | Fujima ..................... | 374/126 |
| 6,097,298 A * | 8/2000 | Brown ..................... | 340/657 |
| 6,196,703 B1 * | 3/2001 | Eusterbrock et al. ......... | 362/276 |
| 6,205,867 B1 * | 3/2001 | Hayes et al. ............. | 73/862.391 |
| 6,229,451 B1 * | 5/2001 | Brown ..................... | 340/657 |
| 6,457,283 B1 * | 10/2002 | Jensen ..................... | 52/101 |
| 6,459,998 B1 * | 10/2002 | Hoffman ............. | H02H 1/0076 340/661 |
| 6,523,424 B1 * | 2/2003 | Hayes et al. ............. | 73/862.391 |
| 7,369,045 B2 * | 5/2008 | Hansen ..................... | 340/538.16 |
| 2005/0113060 A1 * | 5/2005 | Lowery ................. | H04W 84/10 455/402 |
| 2005/0128080 A1 * | 6/2005 | Hall ......................... | B65D 7/00 340/539.26 |
| 2005/0286190 A1 * | 12/2005 | Rostron et al. ................... | 361/65 |
| 2005/0288877 A1 * | 12/2005 | Doig et al. ..................... | 702/60 |
| 2006/0125469 A1 * | 6/2006 | Hansen ..................... | 324/158.1 |
| 2006/0170669 A1 * | 8/2006 | Walker et al. ................. | 345/418 |
| 2007/0041333 A1 * | 2/2007 | Twitchell ..................... | 370/252 |
| 2007/0200556 A1 * | 8/2007 | Engelhardt ................. | 324/158.1 |
| 2008/0012720 A1 * | 1/2008 | Rostron ..................... | 340/664 |
| 2008/0036595 A1 * | 2/2008 | Hollstien et al. .................. | 340/541 |
| 2008/0189061 A1 * | 8/2008 | Scholtz et al. ..................... | 702/65 |
| 2008/0189062 A1 * | 8/2008 | Scholtz et al. ..................... | 702/65 |
| 2008/0204054 A1 * | 8/2008 | Wells ..................... | 324/713 |

(Continued)

*Primary Examiner* — Hoi Lau
(74) *Attorney, Agent, or Firm* — Daniel S. Polley, P.A.

(57) ABSTRACT

A device for automatically detecting a change in position beyond a reference position is provided. Preferably the change in position results from a change in height of an object. In the preferred embodiment inclinometers detect a change in position resulting from an electric line or other suspended object that has descended from its reference position.

18 Claims, 3 Drawing Sheets

(56) References Cited

U.S. PATENT DOCUMENTS

| | | | | |
|---|---|---|---|---|
| 2008/0255779 A1* | 10/2008 | Hull et al. | | 702/57 |
| 2009/0015239 A1* | 1/2009 | Georgiou | | G01R 15/14 324/105 |
| 2009/0243876 A1* | 10/2009 | Lilien | | H02G 1/02 340/870.01 |
| 2011/0077865 A1* | 3/2011 | Chen | | A61B 5/1117 702/3 |
| 2012/0029871 A1* | 2/2012 | Spillane | | H02G 1/02 702/158 |
| 2012/0278011 A1* | 11/2012 | Lancaster | | H02G 1/02 702/57 |
| 2013/0201316 A1* | 8/2013 | Binder | | H04L 67/12 348/77 |
| 2014/0064389 A1* | 3/2014 | Van Fleet | | G01S 13/10 375/257 |
| 2014/0123750 A1* | 5/2014 | Liu | | G01W 1/02 73/170.17 |
| 2014/0136140 A1* | 5/2014 | Chan | | G01H 17/00 702/141 |
| 2015/0075282 A1* | 3/2015 | Chan | | G01H 17/00 73/495 |

\* cited by examiner

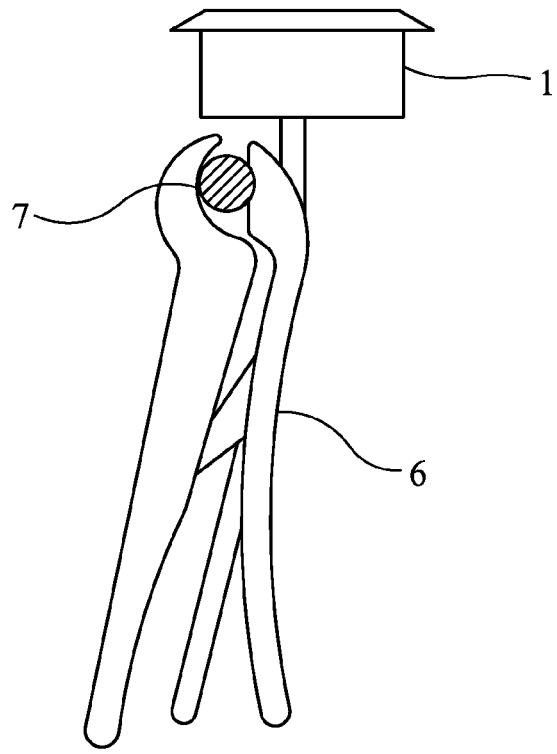
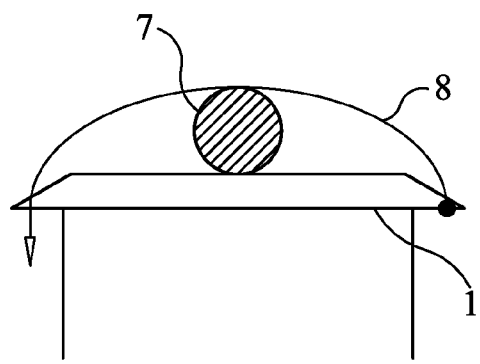
FIG. 2a    FIG. 2b
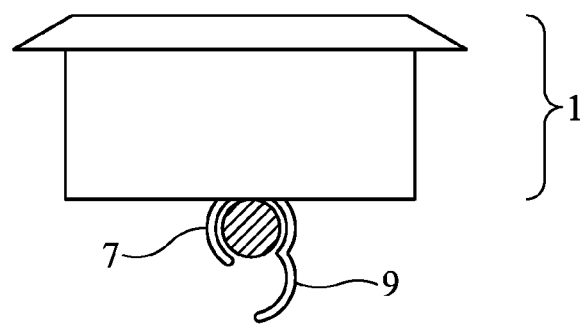
FIG. 2c

DOWNED ITEM DETECTOR

BACKGROUND OF THE INVENTION

This invention was disclosed in the Disclosure Documents Program of the U.S. Patent and Trademark Office on Apr. 18, 2006, Disclosure Document No. 599142.

1. Field of the Invention

This invention relates to safety devices and notification devices, in particular, to a light and/or an alarm that is attached to a power, electric line, or any line as well as any item whose position is desired to be monitored and is activated when the line or item leaves its designated, reference or operative position and is "downed" or falls.

2. Description of Related Art

Downed energized electric lines are a significant risk to public safety. Hurricanes are frequently the cause of a downed power, electric, telephone, signal or transmission lines and because of the generalized geographical nature of the event, the power or other responsible company may not be aware that the line is down, or, even if aware, may not have sufficient manpower to promptly attend to repairing or turning off the power in the line. Each year, many people are electrocuted as a result of this problem. As it is obvious that a downed line is always at a lower altitude than a line in its correct position this device can also be used for the notification of the fact that any raised line is down. This would include antennas, laundry lines, etc.

Since by definition any item that falls is at a lower altitude than its correct position the downed item detector may also serve as a notification device that a painting, picture, lamp, structure or any other item has fallen or collapsed.

It is therefore, to the effective resolution of the aforementioned problems and shortcomings that the present invention is directed.

BRIEF SUMMARY OF THE INVENTION

The foregoing objects are achieved and the foregoing problems are solved in an illustrative embodiment of the invention in which the device is attached to an electric line and when there is a break in the line the line torques as it descends to a lower altitude and the change in position activates the attached device.

More specifically, in devices that are placed in areas that are not easily accessible, the device includes a power source which may derive its energy from solar power and/or electromagnetic energy from the power line to charge rechargeable batteries or a similar power storing device. This allows the device to function in the absence of power in the line. The device is activated by the change in position of the line whether or not the line is powered. This is to guard against a disconnected line suddenly becoming live and hurting a passerby. It is possible to provide additional circuitry, through noninvasive electromagnetic means, that further indicates that a line is energized or not energized.

In devices which are placed in an easily accessible location or indoors, rechargeable and/or non rechargeable batteries and/or wall current may be used. The power source is wired to a light and/or alarm and connected to an inclinometer, accelerometer, tilt switch or gyro device that detects the change in position. The change in position is caused by a break in the electric line that causes the line to descend. As the line descends the relative angle of the line and attached device changes or pivots with respect to the point where the break in the line occurs. The change in position closes the contact within the tilt switch or inclinometer which activates the light or other notifying device. The device is bottom heavy to aid in positioning so if a solar panel is used to provide power to the device, the solar panel will be facing up, towards the sun, and when the power line falls the light and/or alarm can continue to function. An extension piece on the bottom of the device will cause the invention to tilt on its axis if it hits the ground so the alarm remains activated.

If the downed line detector is placed near the power pole there already is an inherent angle of the line in relation to its attachment to the power pole. It is also apparent to one skilled in the art that if the device is attached at a position approximately midway between two poles then the device would be at a more level location in relation to the ground. Compensation for the difference in angles may be made through the adjustment of the attachment of the device to the line or an adjustment to the inclinometer or tilt switch and a reference adjustment may be provided. It is obvious to one skilled in the art that the attachment mechanism of the device to a line may be different than the attachment device to an object, such as a painting. It is also apparent that an altitude sensor or altimeter may be incorporated in the device.

In an alternate embodiment of the device, a transmitter or transponder may be included such that a remote alarm (such as at the power company) may be activated in addition to, or instead of, the illuminating alarm, an audible alarm, such as a siren and/or buzzer, and/or voice-chip or another alarm.

This, or a similar device, may be used for any energized electric line including power, telephone, utility, etc.

This, or a similar device, may be used for any item or object in an elevated location or placed on a structure or portion of a structure in an elevated position. This includes, but is not limited to, artwork, lamps, shelves, sheds, etc.

Accordingly, it as an object of this invention to provide a device that automatically activates a light, audible or other alarm when a line is downed or an object has fallen.

It is yet another object of this invention to provide a device whose power supply is self-recharging when the device is placed in a difficult to access or remote location.

It is still another object of this invention to provide a device that is lightweight, inexpensive to manufacture and easily attached to a line or other item.

BRIEF DESCRIPTION OF THE DRAWINGS

The invention may be better understood by reference to the drawings in which:

FIGS. 2a, 2b and 2c demonstrate the attachment of the Downed Item Detector to a power line;

DETAILED DESCRIPTION OF THE INVENTION

Figure 1A:
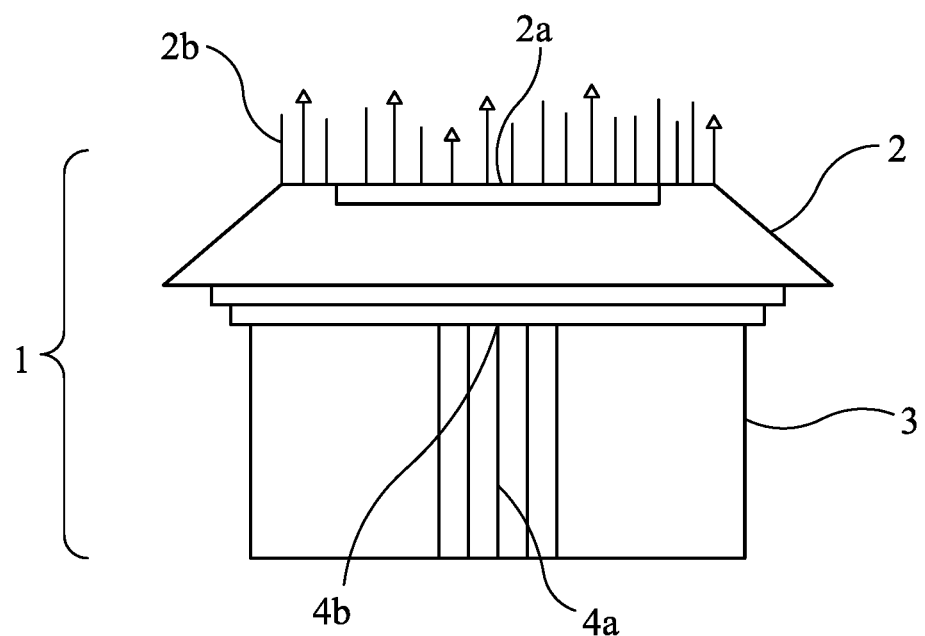
FIG. 1a is a pictorial illustration of a side view of the Downed Item Detector.

FIG. 1a illustrates an embodiment of the Downed Item Detector (1) showing the outer case (2,3). The case (2) is weather tight and is typically made of hard plastic, metal or rubber to protect the inner circuitry against jarring or damage when the power line falls. 2a represents the solar panel that provides electricity for the device. In order to discourage birds, animals, etc. from sitting on the device sharp prongs of differing heights or lengths may be attached to the top surface of the device (2b). Case (3) is made of clear plastic and contains a plastic lens (4a) to increase the illumination provided by the alarm light (4b). The case is waterproofed to protect the circuitry from the elements. It is apparent to one skilled in the art that the inner case may be placed in one or more outer cases to provide additional protection.

Figure 1B:
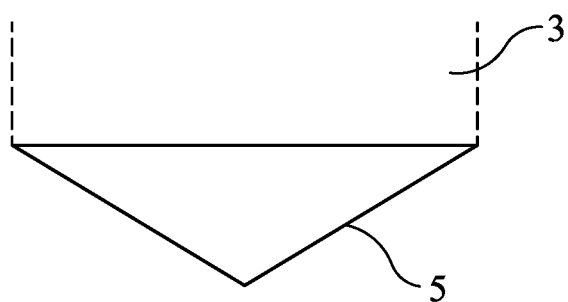
FIG. 1b illustrates an attachment to the bottom of the Downed Item Detector to cushion the device from shocks if it falls to the ground.

In one embodiment, FIG. 1b, the device has extension (5) to serve as a pivot point when the Downed Item Detector descends to the ground. An alternative extension (Sa) may be placed at the edge of the invention so that the device will tilt and activate the alarm. The extensions may also serve as a shock absorber and may be made of rubber or another material to cushion the device from damage when the line breaks and the device hits the ground. The profile of the device is such to minimize wind resistance.

FIG. 2a illustrates one of the attachment mechanisms of the Downed Item Detector (1) to a power line (7) which may include a clamp (6). FIG. 2b demonstrates a locking band (8) that holds the Downed Item Detector (1) to the power line (7). FIG. 2c illustrates another method of locking the device (l) against the power line (7) by a locking clamp (9).

Figure 3:
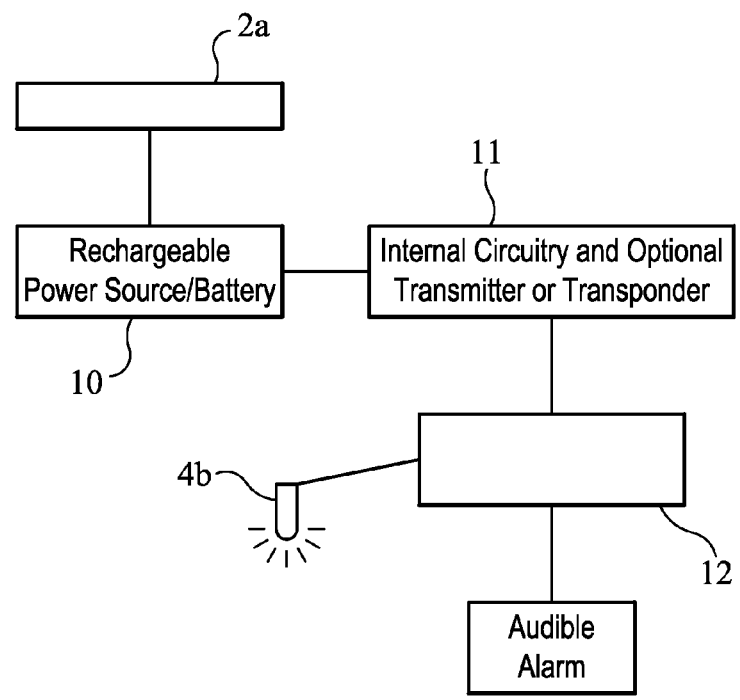
FIG. 3 illustrates the internal circuitry of the device. The solar panel charges rechargeable batteries which provide the power for the device.

FIG. 3 illustrates one embodiment of the Downed Item Detector's internal circuitry which includes a solar panel (2a) connected to one or more rechargeable batteries (10). The batteries maintain enough power to activate the light or alarm for at least 24 hours. In this embodiment the internal circuitry (11) is connected to an inclinometer or tilt switch (12) which is provided that is angled within the device such that the circuit is open. When the device is tilted, as would occur if there was a break in the power line and the line with its attached device fell or rotated around its previous position the circuit would be completed and the light (4b) or alarm would activate.

In an alternate embodiment, the power for the device is provided by the electromagnetic energy generated by the electric line. The device is noninvasive to the line. One method is to use a current transformer to power the device. The electromagnetic energy may be used to charge the rechargeable batteries that provide the power for the invention. This power may be used in addition or instead of the power provided by the solar panel. Additional circuitry could also be provided such that the electromagnetic energy also provides notification that the line is or is not powered or active.

Figure 4:
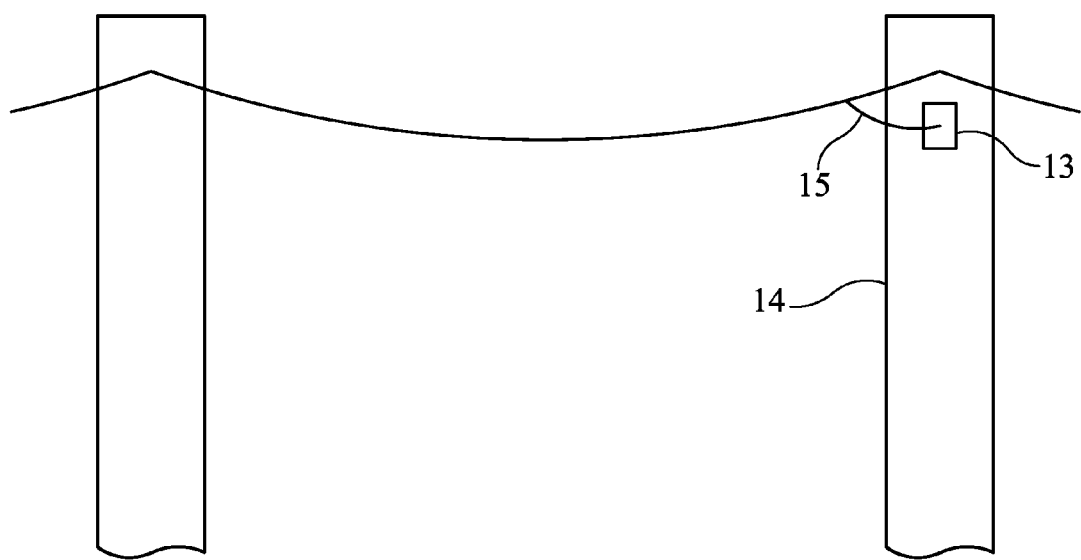
FIG. 4 illustrates an alternative embodiment of the device in which it is attached to a power pole and a non-conducting line is attached to the power line. If the line falls, the change in the tension of the non-conducting line activates the device.

FIG. 4 illustrates an embodiment of the Downed Item Detector (13) where it is attached to a tower (14) and a non-conducting wire (15) is attached to the power line. If the power line breaks and falls, the change in tension in the non-conducting wire activates the invention. The activation may be electrical, magnetic, mechanical or through another method. In this manner, one device may be connected to multiple lines.

Alternatively, the Downed Item Detector may be attached to the power line and the non-conducting wire is attached to the tower. When the line falls, the change in tension in the non-conducting wire activates the device. A conducting wire from the power line may also be used to power the device.

Changes in modifications within the spirit and scope of the invention will be apparent to those skilled in the art. Such modifications and changes are intended to be covered by the claims herein. The illustrated embodiments refer to clamping the downed item detector to the electric line. It is apparent that there are many other alternate ways of attaching the device to a power line. Alternatively, a portion of the device, such as the alarm and rechargeable components may be attached to the pole, tower or structure that holds the lines and another portion of the device such as the solar panel may be attached to the power line and a connecting line between the components may be attached between the power pole or line such that if the line falls its relation to the pole will change and the device will be activated. The device may be placed at various optimized locations along the line and may be attached above, even with or below the line, depending which is most advantageous. Multiple devices may also be used on the same line. When activated, the device may activate a steady or flashing light and/or an audible alarm, like a sound or voice-chip.

It is anticipated that devices, attachments, or other methods to prevent or discourage birds from sitting on the Downed Item Detector may also be employed. One method would be to attach a multitude of thin sharp objects to the top surface of the device to discourage birds from sitting on the device. Another method may be to electrify the sharp objects or prongs that are attached to the top surface of the device which would also discourage the birds, animals, etc. from sitting on the device.

In summary, the invention is a safety device that warns the public when a power line, whether that power line is live or not, has fallen. Its design is to warn people from approaching any downed power line and to prevent possible electrocution and injury or death.

This, or a similar device, may be used for a line, whether electric, or not, to notify or alert when the line is not in its designated position. A similar device, with or without another type of attachment, may be used for an item, such as a painting, or lamp, or a structure, or component of a structure.

While the invention has been described and disclosed in certain terms and has disclosed certain embodiments or modifications, persons skilled in the art who have acquainted themselves with the invention, will appreciate that it is not necessarily limited by such terms, nor to the specific embodiments and modifications disclosed herein. Thus, a wide variety of alternatives, suggested by the teachings herein, can be practiced without departing from the spirit of the invention, and rights to such alternatives are particularly reserved and considered within the scope of the invention

What is claimed is:

1. A device for automatically indicating when a power or electric line is downed or an object has fallen, said device comprising:
   a housing having an upper surface and a lower surface and secured to a power line;
   means for detecting a change in position of an electric or power line or suspended object, said means for detecting secured to an electric line or suspended object;
   means for indicating locally when the change in position exceeds a predetermined threshold, the means for detecting and said means for indicating disposed within said housing; and
   a member secured to said housing, said member having a shave which pivots the housing to a position where the means for detecting allows the means for indicating to be energized.

2. The device for automatically indicating of claim 1 wherein said means for indicating locally is a light or an alarm.

3. The device for automatically indicating of claim 2 wherein said alarm is an audible alarm.

4. The device for automatically indicating of claim 1 wherein said means for detecting is a tilt switch that automatically closes when a change in position of the electric or power line or suspended object is detected based on a pivoted position of the housing from the shape of the member.

5. The device for automatically indicating of claim 1 wherein said means for indicating having a rechargeable power source comprising rechargeable batteries that are recharged by solar power or electromagnetic energy from the power line.

6. The device for automatically indicating of claim 1 wherein said means for indicating locally operating whether or not the power line is still energized while in its downed or fallen position.

7. The device for automatically indicating of claim 1 further comprising a transmitter or transponder for sending an alarm or alert to a remote location from the power line or suspended object when the predetermined threshold has been exceeded.

8. A device for automatically indicating when an power line has fallen to the ground, said device comprising:
   a housing having an upper surface and a lower surface and secured to a power line;
   means for detecting when a power line has fallen to the ground regardless of whether or not the power line is energized, said means for detecting disposed within said housing;
   means for automatically indicating locally when the power line has fallen to the ground so to provide notice to individuals at or close to the fallen power line to avoid touching the power line, said means for indicating disposed within the said housing; and
   a pyramid shaved cushioning member secured to an external surface of said housing, said cushioning member protecting said means for indicating and means for detecting when the power line breaks and falls to the ground and pivoting the housing to a position where the means for detecting allows the means for automatically indicating to be energized.

9. The device for automatically indicating of claim 8 wherein when said housing is secured to the power line the upper surface of said housing having means for discouraging birds and other animals from resting or sitting on said housing extending upward from the upper surface.

10. The device for automatically indicating of claim 9 wherein said means for discouraging are one or more sharp prongs disposed on said upper surface.

11. The device for automatically indicating of claim 8 wherein said housing is constructed from a clear, transparent or translucent material.

12. The device for automatically indicating of claim 8 wherein said housing having a plastic lens and said means for indicating locally comprising a light member which is visible through at least said plastic lens when the change in position of has exceeded the predetermined threshold.

13. The device for automatically indicating of claim 8, wherein said means for detecting is tilt switch that automatically closes when a change in position of the power line is detected based on a pivoted position of the housing from the pyramid shaved cushioning member.

14. The device for automatically indicating of claim 8 wherein said means for automatically indicating having a rechargeable power source.

15. A device for automatically indicating when a power line has fallen to the ground, said device comprising:
   a waterproof housing constructed from a clear, transparent or translucent material and secured to a power line such that the entire housing is above or below the power line prior to the power line fallen to the ground;
   wherein when said housing is secured to the power line a coplanar upper surface of said housing having one or more sharp vertical prongs extending upward from said upper surface for discouraging birds and other animals from resting or sitting on said housing;
   a tilt switch which closes when a power line has fallen to the ground, said tilt switch disposed within said housing;
   means for automatically indicating locally when the power line has fallen to the ground so to provide notice to individuals at or close to the fallen power line to avoid touching the power line, said means for indicating disposed within the said housing; and
   a rechargeable power source in communication with said means for indicating;
   further comprising a pyramid shaped cushioning member secured to an external lower surface of said housing, said cushioning member protecting said means for indicating and means for detecting when the power line breaks and falls to the ground and pivoting the housing to a position where the tilt switch closes to allow said means for automatically indicating to be energized by the rechargeable power source.

16. The device for automatically detecting of claim 1 wherein said member is pyramid shaped and secured to an external surface of the housing.

17. The device for automatically detecting of claim 1 wherein the housing is secured to a power line such that the entire housing is above or below the power line prior to the power line fallen to the ground.

18. The device for automatically detecting of claim 8 wherein the housing is secured to a power line such that the entire housing is above or below the power line prior to the power line fallen to the ground.

\* \* \* \* \*